(12) United States Patent
Ye et al.

(10) Patent No.: US 11,127,879 B2
(45) Date of Patent: Sep. 21, 2021

(54) LIGHT-EMITTING DIODE

(71) Applicant: XIAMEN SAN'AN OPTOELECTRONICS CO., LTD., Xiamen (CN)

(72) Inventors: Daqian Ye, Tianjin (CN); Dongyan Zhang, Tianjin (CN); Chaoyu Wu, Xiamen (CN); Duxiang Wang, Tianjin (CN)

(73) Assignee: Xiamen San'An Optoelectronics Co., Ltd., Fujian (CN)

( * ) Notice: Subject to any disclaimer, the term of this patent is extended or adjusted under 35 U.S.C. 154(b) by 11 days.

(21) Appl. No.: 16/676,839

(22) Filed: Nov. 7, 2019

(65) Prior Publication Data

US 2020/0075800 A1 Mar. 5, 2020

Related U.S. Application Data

(63) Continuation of application No. PCT/CN2018/078658, filed on Mar. 12, 2018.

(30) Foreign Application Priority Data

May 9, 2017 (CN) .......................... 201710323101.6

(51) Int. Cl.
*H01L 33/06* (2010.01)
*H01L 33/14* (2010.01)
*H01L 33/00* (2010.01)
*H01L 33/32* (2010.01)

(52) U.S. Cl.
CPC .......... *H01L 33/06* (2013.01); *H01L 33/0075* (2013.01); *H01L 33/145* (2013.01); *H01L 33/32* (2013.01)

(58) Field of Classification Search
CPC ....... H01L 33/06; H01L 33/145; H01L 33/32; H01L 33/0075
See application file for complete search history.

(56) References Cited

U.S. PATENT DOCUMENTS

| | | | | |
|---|---|---|---|---|
| 5,594,750 A * | 1/1997 | Zhang | .................... | B82Y 20/00 257/14 |
| 7,326,963 B2 * | 2/2008 | Gaska | ..................... | H01L 33/06 257/79 |
| 2013/0228743 A1 * | 9/2013 | Fu | ........................... | H01L 33/06 257/13 |
| 2014/0231745 A1 * | 8/2014 | Northrup | ................ | H01L 33/06 257/13 |

(Continued)

FOREIGN PATENT DOCUMENTS

| CN | 102185057 A | 9/2011 |
|---|---|---|
| CN | 105789392 A | 7/2016 |

(Continued)

*Primary Examiner* — Savitri Mulpuri
(74) *Attorney, Agent, or Firm* — Rosenberg, Klein & Lee

(57) ABSTRACT

Disclosed herein is a light emitting diode (LED), which includes a first-type semiconductor unit, an active layer formed on the first-type semiconductor unit, and a second-type semiconductor unit formed on the active layer oppositely of the first-type semiconductor unit. The second-type semiconductor unit includes a hole storage structure that has a polarization field having a direction pointing toward the active layer.

17 Claims, 5 Drawing Sheets

(56) References Cited

U.S. PATENT DOCUMENTS

2015/0280056 A1* 10/2015 Northrup ............ H01L 33/0075
257/13
2016/0380150 A1* 12/2016 Gaska .................... H01L 33/32
257/13

FOREIGN PATENT DOCUMENTS

CN        107180898 A     9/2017
JP       2005-197293 A    7/2005

* cited by examiner

LIGHT-EMITTING DIODE

CROSS-REFERENCE TO RELATED APPLICATION

This application is a bypass continuation-in-part (CIP) of PCT International Application No. PCT/CN2018/078658, filed on Mar. 12, 2018, which claims priority of Chinese Invention Patent Application No. 201710323101.6, filed on May 9, 2017. The entire content of each of the International and Chinese patent applications is incorporated herein by reference.

FIELD

This disclosure relates to a light-emitting diode, and more particularly to a light-emitting diode having a hole storage structure.

BACKGROUND

A nitride-based semiconductor material has a wide band gap that covers the entire range of visible spectrum. Light-emitting diodes (LEDs) made of the nitride-based semiconductor material has been widely used in various fields such as solid-state displays, lightings, signal lights, etc. Since the nitride-based semiconductor material is non-toxic, highly luminous, and capable of being operated under a low voltage and being miniaturized, there is an irreversible trend of using gallium nitride-based LED as a light source to replace conventional light sources such as fluorescent lamps. In order to develop a nitride-based LED having high luminous efficiency, it is important to increase a concentration of holes and a radiative recombination efficiency of holes and electrons in the LED.

SUMMARY

Therefore, an object of the disclosure is to provide an LED that can alleviate at least one of the drawbacks of the prior art.

According to the disclosure, the LED includes a first-type semiconductor unit, an active layer formed on the first-type semiconductor unit, and a second-type semiconductor unit formed on the active layer oppositely of the first-type semiconductor unit. The second-type semiconductor unit includes a hole storage structure that has a polarization field having a direction pointing toward the active layer.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
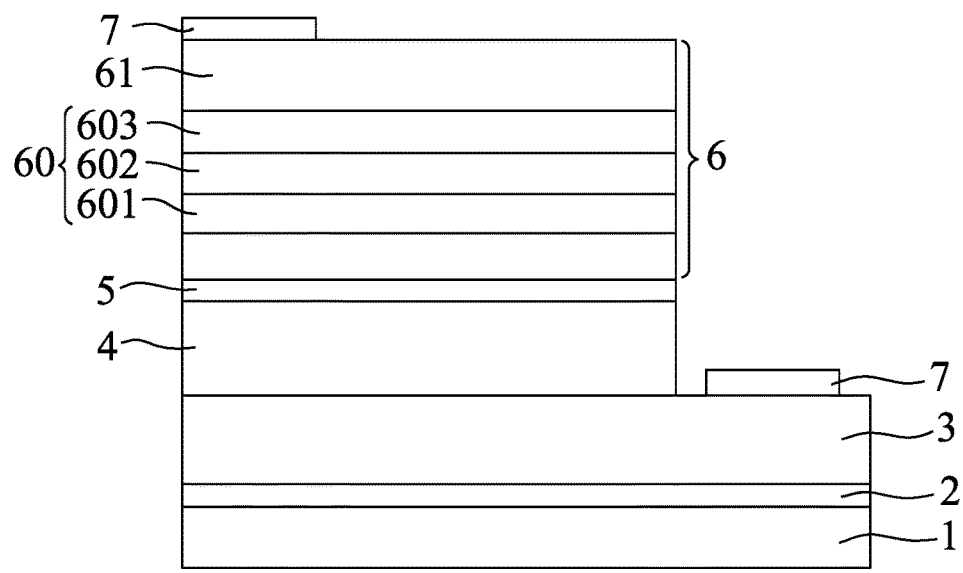
FIG. 1 is a schematic view of an embodiment of a light-emitting diode (LED) according to the disclosure.

Before the disclosure is described in greater detail, it should be noted that where considered appropriate, reference numerals have been repeated among the figures to indicate corresponding or analogous elements, which may optionally have similar characteristics.

Referring to FIG. 1, an embodiment of a light-emitting diode (LED) according to this disclosure includes a substrate 1, a buffer layer 2, a first-type semiconductor unit 3, an active layer 4, an electron blocking layer 5, a second-type semiconductor unit 6, and two electrodes 7.

The buffer layer 2, the first-type semiconductor unit 3, the active layer 4, the electron blocking layer and the second-type semiconductor unit 6 are sequentially formed on the substrate 1 in such order. The two electrodes 7 are respectively formed on the first-type semiconductor unit 3 and the second-type semiconductor unit 6.

The term "first-type" refers to being doped with a first conductivity type dopant, and the term "second-type" refers to being doped with a second conductivity type dopant that is opposite in conductivity type to the first conductivity type dopant. For instance, the first conductivity type dopant may be an N-type dopant, and the second conductivity type dopant may be a P-type dopant, and vice versa.

In this embodiment, the first-type semiconductor unit 3 is an N-type semiconductor unit for providing electrons, and the second-type semiconductor unit 6 is a P-type semiconductor unit for providing holes. The electrodes 7 are a P-type electrode and an N-type electrode respectively formed on the P-type and N-type semiconductor units.

The active layer 4 includes a multiple quantum well (MQW) where the electrons and the holes undergo radiative recombination to emit light.

The second-type semiconductor unit 6 includes a hole storage structure 60 that has a polarization field having a direction pointing toward the active layer 4, i.e., a reversed polarization field, so that the holes in the second-type semiconductor unit 6 may be injected into the active layer 4 in an accelerated manner.

The electron-blocking layer (EBL) 5 is disposed between the active layer 4 and the hole storage structure 60 to prevent electron overflow from the first-type semiconductor unit 3 into the second-type semiconductor unit 6.

In this embodiment, the second-type semiconductor unit 6 further includes a P-type gallium nitride (GaN) cladding layer 61 that is disposed on the hole storage structure 60.

In certain embodiments, the intensity of the polarization field increases along a direction from the second-type semiconductor unit 6 to the active layer 4. In certain embodiments, the hole storage structure 60 has at least two superlattice units, each of which includes multiple pairs of layers.

The layers in each pair include a potential barrier layer and a potential well layer. The potential barrier layers and the potential well layers in each superlattice unit are alternately stacked. In this embodiment, the hole storage structure 60 includes three superlattice units, i.e., a first superlattice unit 601 that is closest to the active layer 4, a second superlattice unit 602 disposed on the first superlattice unit 601, and a third superlattice unit 603 disposed on the second superlattice unit 602 which is farthest away from the active layer 4.

In certain embodiments, each of the superlattice units includes at least three pairs of layers. In certain embodiments, each of the potential barrier layers has a thickness not greater than 1 nm. When the thickness of each of the potential barrier layers is not greater than 1 nm, quantum tunneling effect may occur when the hole concentration reaches a desired level, which may prevent the potential barrier layers having a relatively high potential barrier from blocking the holes.

In certain embodiments, each of the superlattice units has a band gap for the potential barrier layers thereof (i.e., each of the potential barrier layers in the corresponding one of the superlattice units has a same band gap), and the band gaps of the superlattice units decrease in a stepwise manner along a direction away from the active layer 4.

In certain embodiments, each of the superlattice units has a band gap for the potential well layers thereof (i.e., each of the potential well layers in the corresponding one of the superlattice units has a same band gap), and the band gaps of the superlattice units increase in a stepwise manner along a direction away from the active layer 4.

In certain embodiments, in the hole storage structure 60, each of the superlattice units has an intensity of polarization field. The intensity of the polarization field in each of the superlattice units decreases in a stepwise manner along the direction away from the active layer 4. In this embodiment, the intensity of the polarization field of the second superlattice unit 602 is greater than that of the first superlattice unit 601, but is lower than that of the third superlattice unit 603. The p-type gallium nitride cladding layer 61 has an intensity of a polarization field that is lower than those of the superlattice units 601, 602, 603.

In certain embodiments, a number of peak of hole concentration is the same as that of the superlattice units. The peaks of hole concentration are expected to be located at interface regions between any two adjacent ones of the superlattice units, and at an interface region between the superlattice unit that is farthest away from the active layer 4 and the P-type GaN cladding layer 61. In this embodiment, three peaks of hole concentration are present in the second-type semiconductor unit 6, i.e., at an interface region between the first and second superlattice units 601, 602, an interface region between the second and third superlattice units 602, 603, and an interface region between the third superlattice units 603 and the P-type GaN cladding layer 61.

In certain embodiments, the hole storage structure 60 is made of a polarized material.

In certain embodiments, in the hole storage structure 60, each of the potential barrier layers is made of an aluminum gallium nitride (AlGaN)-based material and each of the potential well layers is made of a gallium nitride (GaN)-based material, the potential barrier layers in one of the superlattice units that is closest to the active layer 4 have a same Al content that ranges from 25 mol % to 100 mol % based on a total amount of moles of each of the potential barrier layers, and the potential barrier layers of a remainder of the superlattice units have Al contents that decrease by 5 mol % to 45 mol % in a stepwise manner along the direction away from the active layer 4. In an example of this embodiment, each of the potential barrier layers in the first superlattice unit 601 may have a same Al content that ranges from 25 mol % to 100 mol %, each of the potential barrier layers in the second superlattice unit 602 may have a same Al content that ranges from 15 mol % to 90 mol %, and each of the potential barrier layers in the third superlattice unit 603 may have a same Al content that ranges from 5 mol % to 80 mol %.

In certain embodiments, in the hole storage structure 60, each of the potential barrier layers is made of an aluminum gallium nitride (AlGaN)-based material and each of the potential well layers is made of an indium gallium nitride (InGaN)-based material, the potential barrier layers in one of the superlattice units that is closest to the active layer 4 have a same Al content that ranges from 25 mol % to 100 mol % based on a total amount of moles of each of the potential barrier layers, and the potential barrier layers of a remainder of the superlattice units have Al contents that decrease by 5 mol % to 20 mol % in a stepwise manner along the direction away from the active layer 4. In addition, the potential well layers in one of the superlattice units that is closest to the active layer 4 may have a same In content that ranges from 10 mol % to 15 mol % based on a total amount of moles of each of the potential well layers, and the potential well layers of a remainder of the superlattice units has In contents that decrease by more than 5 mol % in a stepwise manner along the direction away from the active layer 4.

In an example of the hole structure 60 having the aforesaid first to three superlattice unit 601, 602, 603 and a fourth superlattice unit disposed on the third superlattice unit 603, each of the potential barrier layers in the first superlattice unit 601 may have the same Al content that ranges from 20 mol % to 25 mol %, each of the potential barrier layers in the second superlattice unit 602 may have the same Al content that ranges from 15 mol % to 20 mol %, each of the potential barrier layers in the third superlattice unit 603 may have the same Al content that ranges from 10 mol % to 15 mol %, and each of the potential barrier layers in the fourth superlattice unit may have the same Al content that ranges from 5 mol % to 10 mol %. In addition, each of the potential well layers in the first superlattice unit 601 may have the same In content that ranges from 10 mol % to 15 mol %, each of the potential well layers in the second superlattice unit 602 may have the same In content that ranges from 5 mol % to 10 mol %, each of the potential well layers in the third superlattice unit 603 may have the same In content that ranges from 3 mol % to 5 mol %, and each of the potential well layers in the fourth superlattice unit may have the same In content that ranges from 0 mol % to 3 mol %.

In certain embodiments, in the hole storage structure 60, each of the potential barrier layers is made of a gallium nitride (GaN)-based material, and each of the potential well layers is made of an indium gallium nitride (InGaN)-based material. The potential well layers in one of the superlattice units that is closest to the active layer 4 have a same In content that ranges from 10 mol % to 15 mol % based on a total amount of moles of each of the potential well layers, and the potential well layers of a remainder of the superlattice units have In contents that decrease by more than 5 mol % in a stepwise manner along the direction away from the active layer 4. In an example of this embodiment, each of the potential well layers in the first superlattice unit 601 may have the same In content that ranges from 10 mol % to 15 mol %, each of the potential well layers in the second superlattice unit 602 may have the same In content that ranges from 5 mol % to 10 mol %, and each of the potential well layers in the third superlattice unit 603 may have the same In content that ranges from 0 mol % to 5 mol %.

In certain embodiments, when each of the potential well layers is made of a gallium nitride (GaN)-based material, each of the potential well layers may be further doped with magnesium in a concentration that is not greater than $10^{17}$ atoms/cm$^{-3}$, so as to prevent the formation of a pn junction between the hole storage structure 60 and the P-type GaN cladding layer 61.

The disclosure will be further described by way of the following examples. However, it should be understood that the following examples are solely intended for the purpose of illustration and should not be construed as limiting the disclosure in practice.

EXAMPLES

Example 1

A light-emitting diode (LED) of Example 1 has a structural configuration as shown in FIG. 1. In the hole storage structure 60 of Example 1, each of the first, second and third superlattice units 601, 602, 603 is a AlGaN/GaN superlattice unit and has eight pairs of layers. That is, each of the potential barrier layers having a thickness of about 0.8 nm is made of an aluminum gallium nitride (AlGaN)-based material, and each of the potential well layers having a thickness of about 2 nm is made of a gallium nitride (GaN)-based material.

Figure 2:
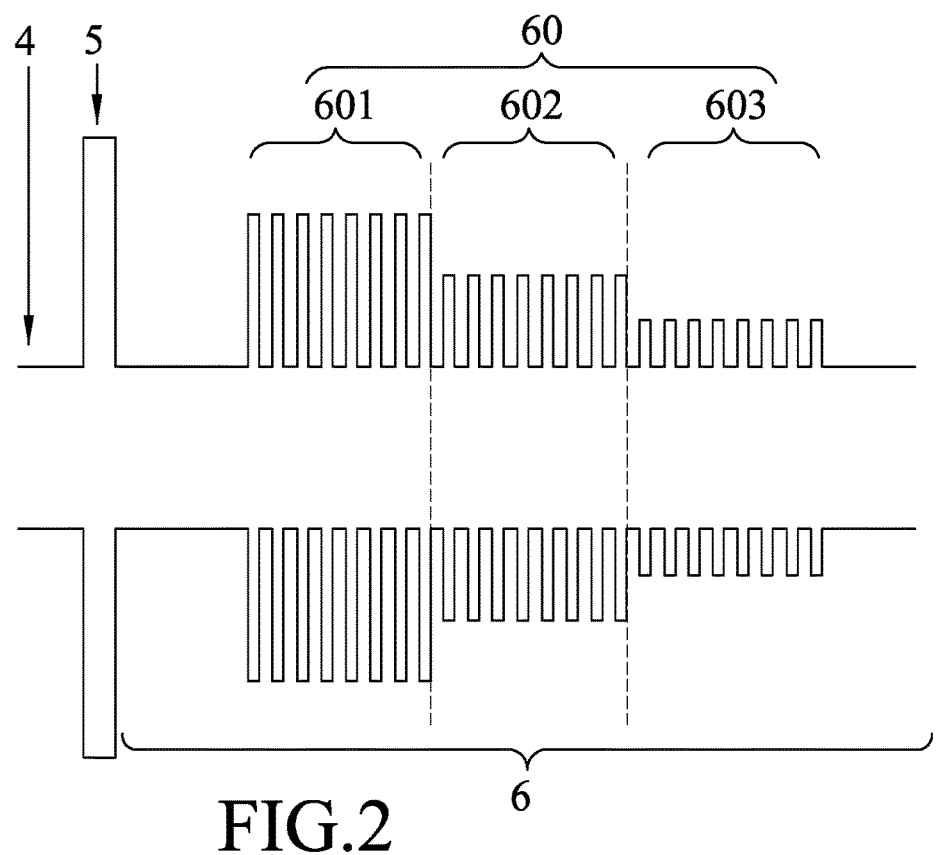
FIG. 2 is an energy band diagram of an active layer, an electron blocking layer and a second-type semiconductor unit having a hole storage structure in an LED of Example 1.

In Example 1, each of the potential barrier layers in the first superlattice unit 601 has an Al content of 25 mol %, each of the potential barrier layers in the second superlattice unit 602 has an Al content of 15 mol %, and each of the potential barrier layers in the third superlattice unit 603 has an Al content of 5 mol %, based on a total amount of moles of each of the potential barrier layers. As shown in FIG. 2, the band gaps for the potential barrier layers in the first, second and third superlattice units 601, 602, 603 of Example 1 decrease in a stepwise manner. That is, the band gap for the potential barrier layers in the first superlattice unit 601 is greater than that of the second superlattice unit 602, and the band gap for the potential barrier layers in the second superlattice unit 602 is greater than that of the third superlattice unit 603. In addition, the band gaps for the potential well layers in the first, second and third superlattice units 601, 602, 603 of Example 1 are the same.

Figure 3:
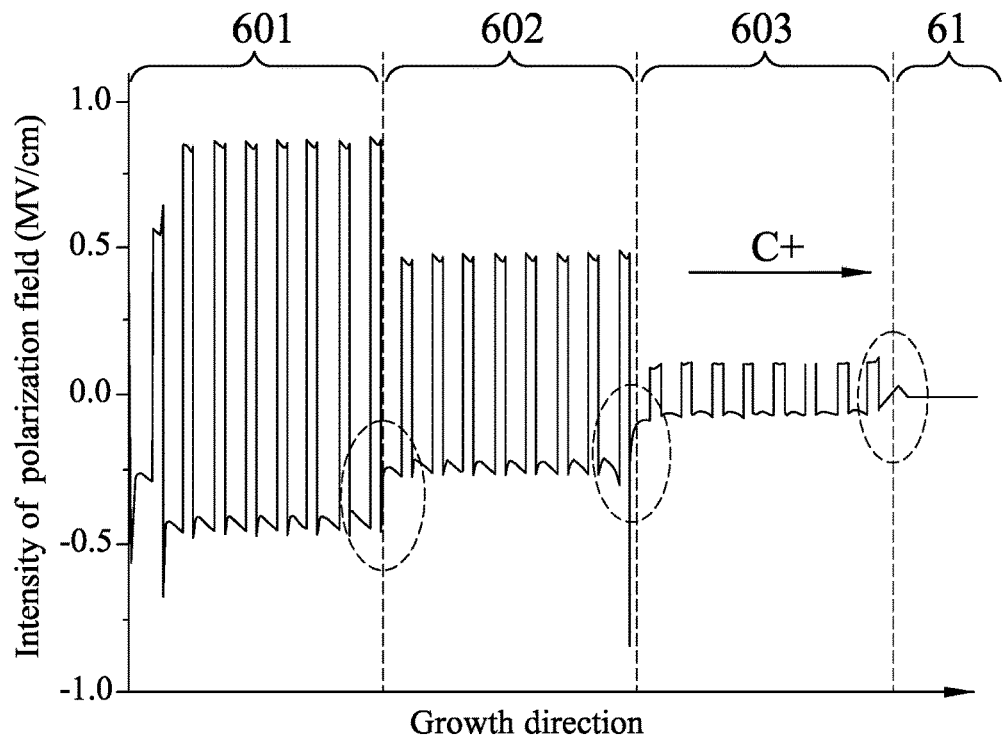
FIG. 3 is a plot illustrating an intensity of polarization field in the hole storage structure of Example 1 along a growth direction of the LED.

Referring to FIG. 3, in the hole storage structure 60 of Example 1, each of the superlattice units 601, 602, and 603 has an intensity of polarization field, and the intensity of the polarization field in each of the superlattice units also decreases in a stepwise manner. That is, the intensity of the polarization field in the first superlattice unit 601 is greater than that of the second superlattice unit 602, and the intensity of the polarization field in the second superlattice unit 602 is greater than that of the third superlattice unit 603. The P-type GaN cladding layer 61 has an intensity of the polarization field of zero. The difference in the intensity of the polarization field between the P-type GaN cladding layer 61 and the first superlattice unit 601, that between the P-type GaN cladding layer 61 and the second superlattice unit 602, and that between in the P-type GaN cladding layer 61 and the third superlattice unit 603 are −0.5 MV/cm, −0.25 MV/cm, and −0.05 MV/cm, respectively. In addition, the difference in the intensity of the polarization field between the first and second superlattice units 601, 602, that between the second and third superlattice units 602, 603, and that between the third superlattice unit 603 and the P-type GaN cladding layer 61 are calculated to be −0.25 MV/cm, −0.20 MV/cm, and −0.05 MV/cm. The results indicate that the intensities of the polarization field increase sharply at an interface region between the first and second superlattice units 601, 602, at an interface region between the second and third superlattice units 602, 603, and at an interface region between the third superlattice unit 603 and the P-type GaN cladding layer 61 (respectively shown as dashed circle lines in FIG. 3). Such intensity difference of the polarization field between these interface regions is expected to be effective in providing energy to the holes contained therein and accelerating the energy to migrate from the second-type semiconductor unit 6 toward the active layer 4. In addition, in the superlattice unit of the hole storage structure 60, the GaN-based potential well layers have relatively low potential barrier compared to that of the AlGaN-based potential barrier layers, so that the holes accelerated by the polarization field may tend to accumulate in the GaN potential well layers, thereby achieving the desired hole storage effect in the hole storage structure 60.

Figure 4:
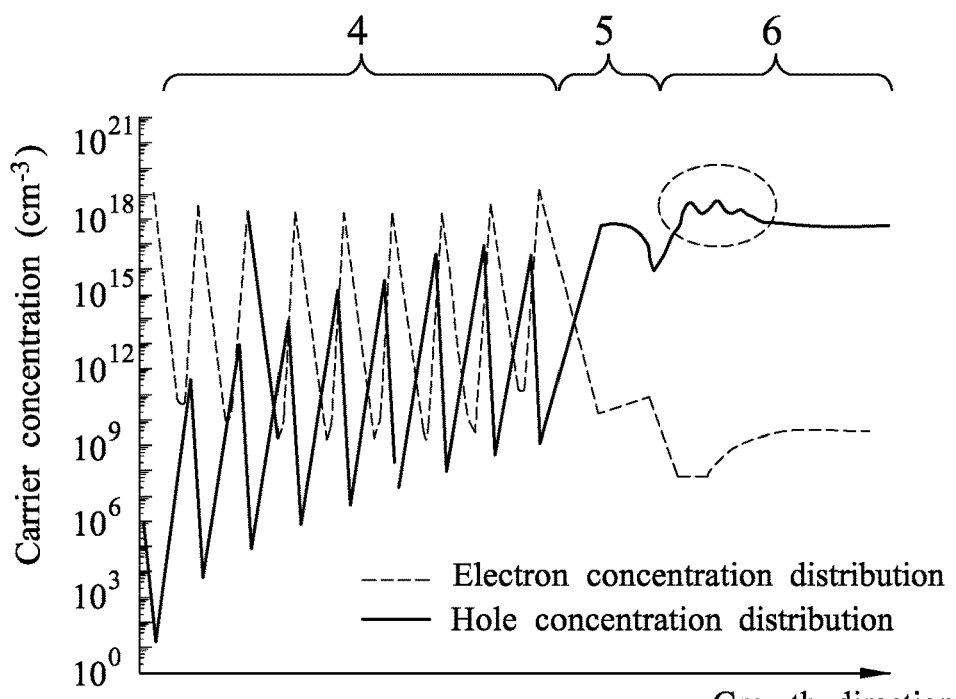
FIG. 4 is a plot illustrating concentration distributions of carriers (i.e., electrons and holes) in the active layer, the electron blocking layer and the second-type semiconductor unit of Example 1 along the growth direction of the LED.

Referring to FIG. 4, it can be observed that the hole storage structure 60 has three peaks of hole concentration as shown by the dashed circle line, which are correspondingly present in the regions as shown by dashed circle lines in FIG. 3, i.e., the interface region between the first and second superlattice units 601, 602, the interface region between the second and third superlattice units 602, 603, and the interface region between the third superlattice unit 603 and the P-type GaN cladding layer 61. Each of the peaks of hole concentration is greater than $1\times10^{18}$ cm$^{-3}$, which is 0.5 to 10 times greater than the hole concentration in the P-type GaN cladding layer 61.

Example 2

The LED of Example 2 has a structural configuration similar to that of Example 1, except for the composition and numbers of pairs in the first to third superlattice units 601, 602, 603 of the hole storage structure 60.

To be specific, in the hole storage structure 60 of Example 2, each of the first, second and third superlattice units 601, 602, 603 is a GaN/InGaN superlattice unit. That is, each of the potential barrier layers is made of a GaN-based material, and each of the potential well layers is made of an indium gallium nitride (InGaN)-based material. The first superlattice unit 601 includes four pairs of layers, and each of the second and third superlattice units 602, 603 includes three pairs of layers. In addition, each of the potential well layers in the first superlattice unit 601 has a same In content that ranges from 10 mol % to 15 mol %, each of the potential well layers in the second superlattice unit 602 has a same In content that ranges from 5 mol % to 10 mol %, and each of the potential well layers in the third superlattice unit 603 has a same In content that ranges from 0 mol % to 5 mol %, based on a total amount of moles of each of the potential well layers.

Figure 5:
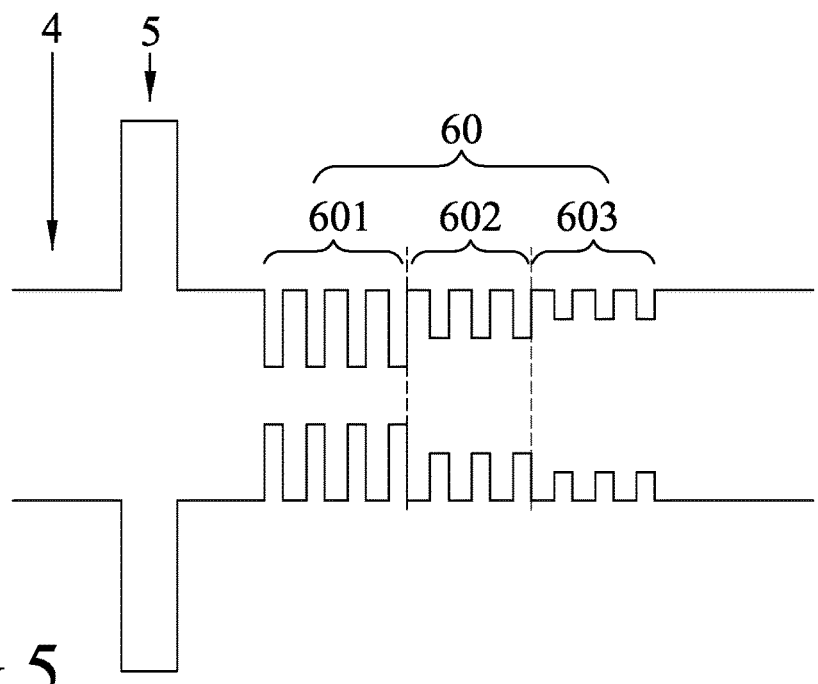
FIG. 5 is an energy band diagram of the active layer, the electron blocking layer and the second-type semiconductor unit in an LED of Example 2.

Referring to FIG. 5, the band gaps for the potential well layers in the first, second and third superlattice units 601, 602, 603 of Example 2 increase in a stepwise manner. That is, the band gap for the potential well layers of the first superlattice unit 601 is smaller than that of the second superlattice unit 602, and the band gap for the potential well layers of the second superlattice unit 602 is smaller than that of the third superlattice unit 603. The band gaps for the potential barriers layers of the first, second and third superlattice units 601, 602, 603 are the same.

Similar to Example 1, with the stepwise variation of the energy band in the hole storage structure 60, the resultant polarization field would accelerate the holes to migrate from the hole storage structure 60 into the active layer 4. As such, the radiative recombination efficiency in the active layer 4 may be significantly increased, and an improved hole storage effect may also be achieved. In addition, since each of the superlattice units in the hole storage structure 60 of Example 2 does not include a material with a high potential barrier (e.g., AlGaN-based material used in the potential barrier layers of Example 1), the LED of Example 2 may require a lower turn-on voltage as compared to the LED of Example 1.

Example 3

The LED of Example 3 has a structural configuration similar to that of Example 1, except that the hole storage structure 60 of Example 3 further includes a fourth superlattice unit 604 that is disposed between the third superlattice unit 603 and the P-type GaN cladding layer 61, and each of the first to fourth superlattice units 601, 602, 603, 604 includes four pairs of layers. In addition, the compositions of the first to fourth superlattice units 601, 602, 603, 604 are different from those in Example 1.

To be specific, each of the first to fourth superlattice units 601, 602, 603, 604 is an AlGaN/InGaN superlattice unit. That is, each of the potential barrier layers is made of an AlGaN-based material, and each of the potential well layers is made of an InGaN-based material. In particular, each of the potential barrier layers in the first superlattice unit 601 has an Al content of 25 mol %, each of the potential barrier layers in the second superlattice unit 602 has an Al content of 20 mol %, each of the potential barrier layers in the third superlattice unit 603 has an Al content of 15 mol %, and each of the potential barrier layers in the fourth superlattice unit has an Al content of 10 mol %, based on total amount of moles of each of the potential barrier layers. In addition, each of the potential well layers in the first superlattice unit 601 has the same In content that ranges from 10 mol % to 15 mol %, each of the potential well layers in the second superlattice unit 602 has the same In content that ranges from 5 mol % to 10 mol %, each of the potential well layers in the third superlattice unit 603 has the same In content that ranges from 3 mol % to 5 mol %, and each of the potential well layers in the fourth superlattice unit 604 has the same In content that ranges from 0 mol % to 3 mol %, based on a total amount of moles of each of the potential well layers, i.e., the potential well layers in the first to fourth superlattice units 601, 602, 603, and 604 have In contents that decrease by more than 5 mol % in a stepwise manner.

Figure 6:
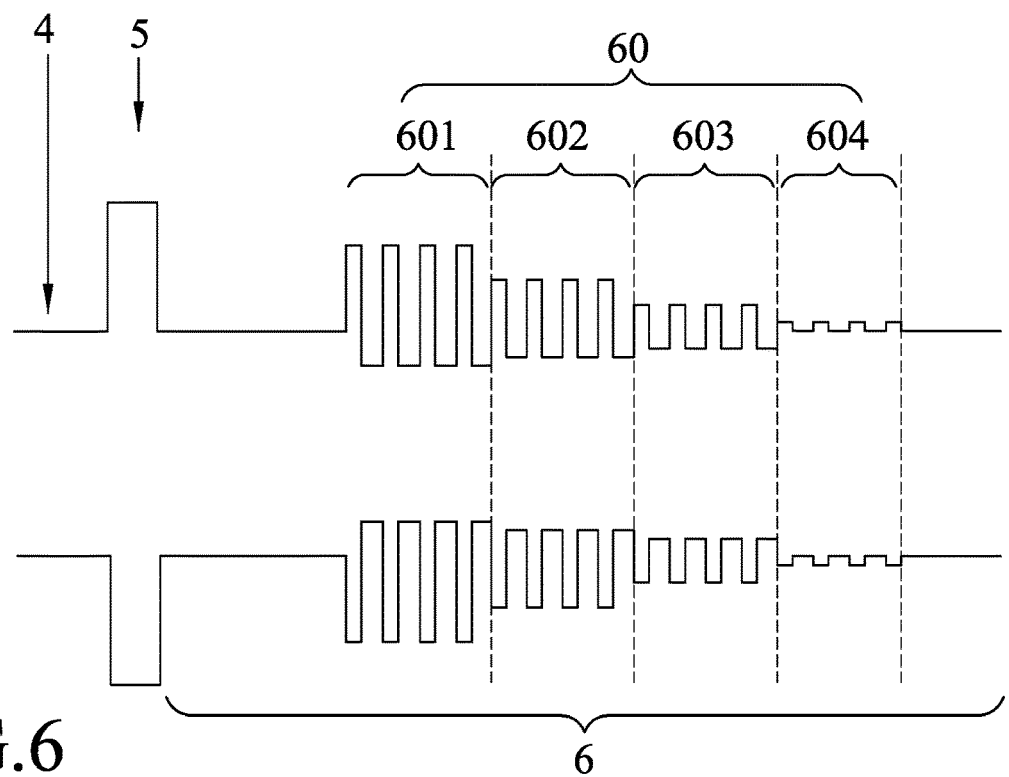
FIG. 6 is an energy band diagram of the active layer, the electron blocking layer and the second-type semiconductor unit in an LED of Example 3.

Referring to FIG. 6, the band gaps for the potential barrier layers in the first to fourth superlattice units 601, 602, 603, 604 of Example 3 decrease in a stepwise manner, and the band gaps for the potential well layers in the first to fourth superlattice units 601, 602, 603, 604 increase in a stepwise manner. That is, in terms of the band gap for the potential barrier layers, the first superlattice unit 601 is greater than the second superlattice unit 602, the second superlattice unit 602 is greater than the third superlattice unit 603, and the third superlattice unit 603 is greater than the fourth superlattice unit. In terms of the band gap for the potential well layers, the first superlattice unit 601 is smaller than the second superlattice unit 602, the second superlattice unit 602 is smaller than the third superlattice unit 603, and the third superlattice unit 603 is smaller than the fourth superlattice unit.

With the stepwise variation of the band gap in both of the potential barrier layers and the potential well layers of the hole storage structure 60, the LED of Example 3 is expected to exhibit an improved hole storage effect as compared to those of Examples 1 to 2.

Example 4

The LED of Example 4 has a structural configuration similar to that of Example 3, except for the composition of the first to fourth superlattice units 601, 602, 603, 604 of the hole storage structure 60, each of which is a AlGaN/GaN superlattice unit.

To be specific, each of the potential barrier layers in the first superlattice unit 601 has an Al content of 35 mol %, each of the potential barrier layers in the second superlattice unit 602 has an Al content of 25 mol %, each of the potential barrier layers in the third superlattice unit 603 has an Al content of 15 mol %, and each of the potential barrier layers in the fourth superlattice unit has an Al content of 5 mol %, based on a total amount of moles of each of the potential barrier layers. The potential well layers in each of the first to fourth superlattice units 601, 602, 603, 604 are the same.

Figure 7:
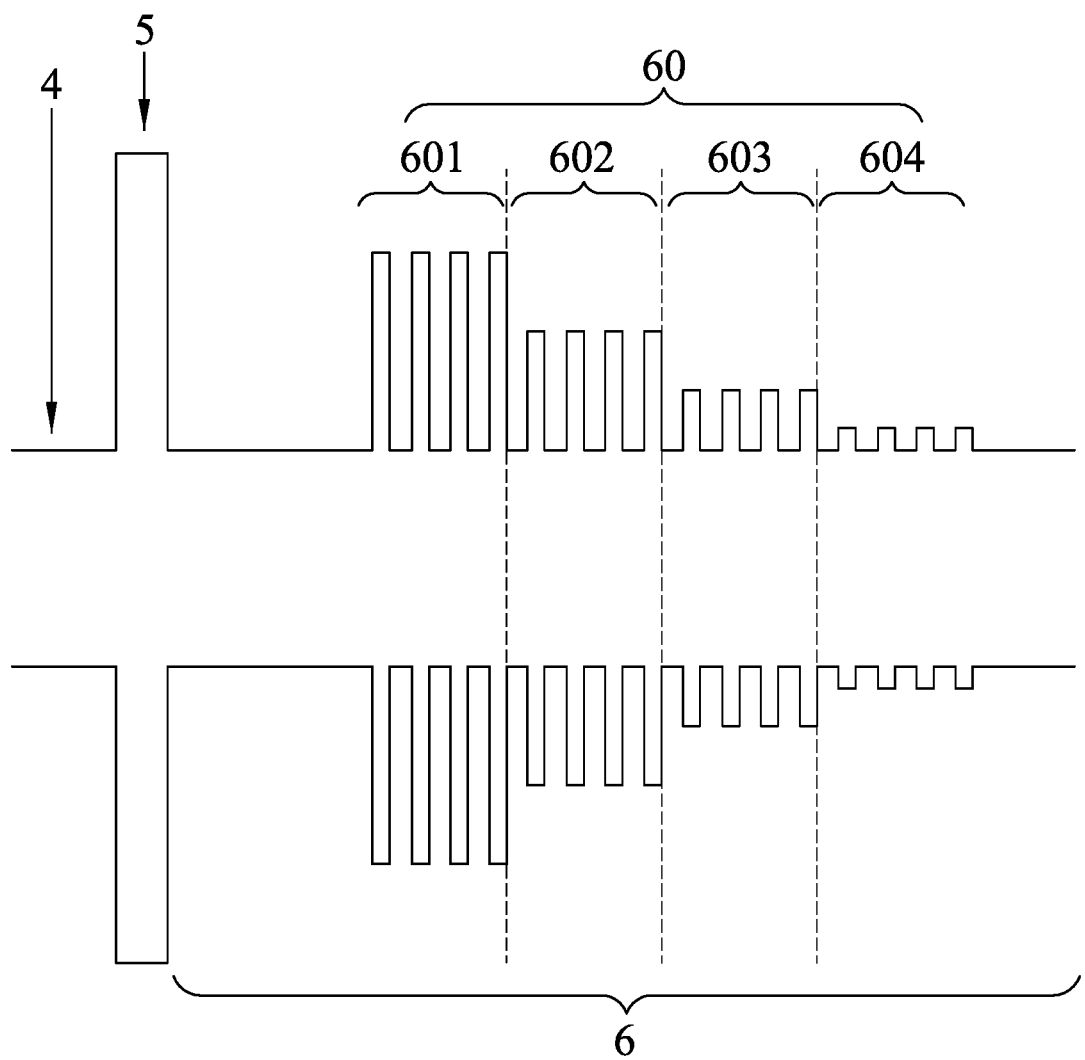
FIG. 7 is an energy band diagram of the active layer, the electron blocking layer and the second-type semiconductor unit in an LED of Example 4.

Referring to FIG. 7, the band gaps for the potential barrier layers in the first to fourth superlattice units 601, 602, 603, 604 of Example 4 decrease in a stepwise manner. That is, in terms of the band gap for the potential barrier layers, the first superlattice unit 601 is greater than the second superlattice unit 602, the second superlattice unit 602 is greater than the third superlattice unit 603, and the third superlattice unit 603 is greater than the fourth superlattice unit 604.

Similar to Example 3, by including four superlattice units, the hole storage structure 60 of Example 4 may have four peaks of hole concentration. An additional peak of hole concentration compared to Examples 1 and 2 indicates that the hole storage structure 60 of Example 4 would have a higher hole concentration, and therefore exhibits an improved hole storage effect. In addition, with increased pairs of layers in the superlattice units, the time period for the holes staying and accelerating in the hole storage structure 60 may be increased, and the holes may obtain a higher energy for migration to the active layer 4. However, having more pairs of layers in the superlattice units may increase the manufacturing cost.

Example 5

The LED of Example 5 has a structural configuration similar to that of Example 1, except that the hole storage structure 60 of the LED of Example 5 only includes the first and second superlattice units 601, 602, each of which is a AlGaN/GaN superlattice unit that has eight pairs of layers.

To be specific, each of the potential barrier layers in the first superlattice unit 601 has an Al content of 50 mol %, and each of the potential barrier layers in the second superlattice unit 602 has an Al content of 5 mol %, based on a total amount of moles of each of the potential barrier layers. The potential well layers in each of the first and second superlattice units 601, 602 are the same.

Figure 8:
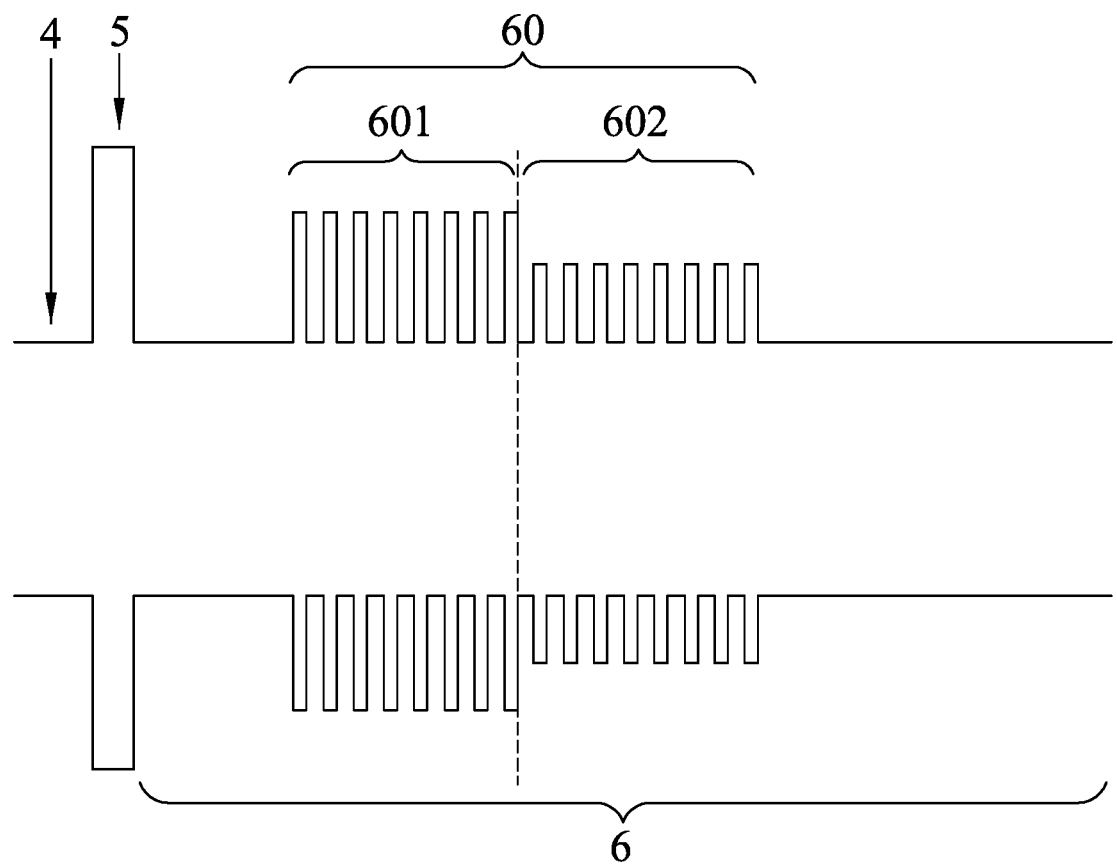
FIG. 8 is an energy band diagram of the active layer, the electron blocking layer and the second-type semiconductor unit in an LED of Example 5.

Referring to FIG. 8, the band gap for the potential barrier layers in the first superlattice unit 601 is greater than that of the second superlattice unit 602. Since the difference of the Al content between the first and second superlattice units 601, 602 is 45 mol %, the difference between the intensity of the polarization field in the first superlattice units 601 and that of the second superlattice units 602 would be large. Therefore, the hole storage structure 60 of Example 5 may have a high hole concentration that is present at an interface region between the first and second superlattice units 601, 602 and that is greater than $5 \times 10^{19}$ cm$^{-3}$. As such, the hole storage structure 60 of Example 5 may exhibit an improved hole storage effect.

In summary, by including the hole storage structure 60 having a polarization field with a direction pointing toward the active layer 4 (i.e., a reversed polarization field) in the second-type semiconductor unit 6, the holes can be accelerated by the polarization field to migrate from the second-type semiconductor unit 6 to the active layer 4, which enhances the radiative recombination efficiency of the holes and electrons, thereby improving the luminous efficiency of the LED of this disclosure.

In the description above, for the purposes of explanation, numerous specific details have been set forth in order to provide a thorough understanding of the embodiments. It will be apparent, however, to one skilled in the art, that one or more other embodiments maybe practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light emitting diode, comprising:
   a first-type semiconductor unit;
   an active layer formed on said first-type semiconductor unit; and
   a second-type semiconductor unit formed on said active layer oppositely of said first-type semiconductor unit and including a hole storage structure that has a polarization field having a direction pointing toward said active layer, said hole storage structure having at least two superlattice units, each of said superlattice units including multiple pairs of layers, said layers in each pair including a potential barrier layer and a potential well layer, said potential barrier layers and said potential well layers in each of said superlattice units being alternately stacked, each of said superlattice units having a band gap for said potential barrier layers thereof, the band gaps of said superlattice units decreasing in a stepwise manner along a direction away from said active layer, and each of said superlattice units having a band gap for said potential well layers thereof, the band gaps of said superlattice units increasing in a stepwise manner along a direction away from said active layer,
   wherein said second-type semiconductor unit further includes a p-type gallium nitride cladding layer that is disposed on said hole storage structure, and said light emitting diode further comprising an electron-blocking layer that is disposed between said active layer and said hole storage structure.

2. The light emitting diode according to claim 1, wherein an intensity of the polarization field in said hole storage structure increases along a direction from said second-type semiconductor unit to said active layer.

3. The light emitting diode according to claim 1, wherein, in said hole storage structure, each of said superlattice units has an intensity of polarization field, the intensities of the polarization field in said superlattice units decreasing in the stepwise manner.

4. The light emitting diode according to claim 3, wherein, in said hole storage structure, each of said superlattice units has an intensity of polarization field, the stepwise decrease in the intensities of the polarization field in said superlattice units decreasing in a stepwise manner decrease along a direction away from said active layer.

5. The light emitting diode according to claim 1, wherein each of said superlattice units has at least three pairs of layers.

6. The light emitting diode according to claim 1, wherein a number of peak of hole concentration is the same as that of said superlattice units.

7. The light emitting diode according to claim 1, wherein, in said hole storage structure, each of said potential barrier layers is made of an aluminum gallium nitride (AlGaN)-based material and each of said potential well layers is made of a gallium nitride (GaN)-based material, said potential barrier layers in one of said superlattice units that is closest to said active layer having a same Al content that ranges from 20 mol % to 100 mol % based on a total amount of moles of each of said potential barrier layers, and said potential barrier layers of a remainder of said superlattice units having Al contents that decrease by 5 mol % to 45 mol % in a stepwise manner.

8. The light emitting diode according to claim 7, wherein said hole storage structure has a first superlattice unit that is closest to said active layer, a second superlattice unit disposed on said first superlattice unit, and a third superlattice unit disposed on said second superlattice unit which is farthest away from said active layer, each of said potential barrier layers in said first superlattice unit having an Al content ranging from 25 mol % to 100 mol %, each of said potential barrier layers in said first superlattice unit having an Al content ranging from 15 mol % to 90 mol %, and each of said potential barrier layers in said third superlattice unit having an Al content ranging from 5 mol % to 80 mol %.

9. The light emitting diode according to claim 1, wherein, in said hole storage structure, each of said potential barrier layers is made of an aluminum gallium nitride (AlGaN)-based material and each of said potential well layers is made of an indium gallium nitride (InGaN)-based material, said potential barrier layers in one of said superlattice units that is closest to said active layer having a same Al content that ranges from 20 mol % to 100 mol % based on a total amount of moles of each of said potential barrier layers, said potential barrier layers of a remainder of said superlattice units having Al contents that decrease by 5 mol % to 20 mol % in a stepwise manner.

10. The light emitting diode according to claim 9, wherein said potential well layers in one of said superlattice units that is closest to said active layer has a same In content that ranges from 10 mol % to 15 mol % based on a total amount of moles of each of said potential well layers, said potential well layers of a remainder of said superlattice units having In contents that decrease by more than 5 mol % in a stepwise manner.

11. The light emitting diode according to claim 10, wherein said hole storage structure has a first superlattice unit that is closest to said active layer, a second superlattice unit disposed on said first superlattice unit, a third superlattice unit disposed on said second superlattice unit, and a fourth superlattice structure disposed on said third superlattice unit which is farthest away from said active layer, each of said potential barrier layers in said first superlattice unit having an Al content ranging from 20 mol % to 25 mol % based on a total amount of moles of each of said potential barrier layers, each of said potential barrier layers in said second superlattice unit having an Al content ranging from 15 mol % to 20 mol %, each of said potential barrier layers in said third superlattice unit having an Al content ranging from 10 mol % to 15mol %, and each of said potential barrier layers in said fourth superlattice unit having an Al content ranging from 5 mol % to 10 mol %.

12. The light emitting diode according to claim 10, wherein said hole storage structure has a first superlattice unit that is closest to said active layer, a second superlattice unit disposed on said first superlattice unit, a third superlattice unit disposed on said second superlattice unit, and a fourth superlattice unit disposed on said third superlattice unit which is farthest away from said active layer, each of said potential well layers in said first superlattice unit having an In content ranging from 10 mol % to 15 mol % based on a total amount of moles of each of said potential well layers, each of said well layers in said second superlattice unit having an In content ranging from 5 mol % to 10 mol %, each of said potential well layers in said third superlattice unit having an In content ranging from 3 mol % to 5 mol %, and each of said potential well layers in said fourth superlattice unit having an In content ranging from 0 mol % to 3 mol %.

13. The light emitting diode according to claim 1, wherein, in said hole storage structure, each of said potential barrier layers is made of a gallium nitride (GaN)-based material, and each of said potential well layers is made of an indium gallium nitride (InGaN)-based material, said potential well layers in one of said superlattice units that is closest to said active layer having a same In content that ranges from 10 mol % to 15 mol % based on a total amount of moles of each of said potential well layers, said potential well layers of a remainder of said superlattice units having In contents that decrease by more than 5 mol % in a stepwise manner.

14. The light emitting diode according to claim 13, wherein said hole storage structure has a first superlattice unit that is closest to said active layer, a second superlattice unit disposed on said first superlattice unit, and a third superlattice unit disposed on said second superlattice unit which is farthest away from said active layer, each of said potential well layers in said first superlattice unit having an In content ranging from 10 mol % to 15 mol % based on a total amount of moles of each of said potential well layers, each of said well layers in said second superlattice unit having an In content ranging from 5 mol % to 10 mol %, and each of said potential well layers in said third superlattice unit having an In content ranging from 0 mol % to 5 mol %.

15. The light emitting diode according to claim 1, wherein each of said potential barrier layers has a thickness not greater than 1 nm.

16. The light emitting diode according to claim 1, wherein said hole storage structure is made of a polarized material.

17. The light emitting diode according to claim 1, wherein, in said second-type semiconductor unit, the p-type gallium nitride cladding layer has an intensity of a polarization field that is lower than those of said superlattice units.

* * * * *